United States Patent [19]

Yamasaki et al.

[11] Patent Number: 6,122,036
[45] Date of Patent: *Sep. 19, 2000

[54] PROJECTION EXPOSURE APPARATUS AND METHOD

[75] Inventors: Shigeru Yamasaki, Kumagaya; Masahiko Okumura, Tokyo, both of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/206,238

[22] Filed: Dec. 7, 1998

Related U.S. Application Data

[63] Continuation of application No. 08/744,196, Nov. 5, 1996, abandoned, which is a continuation-in-part of application No. 08/326,398, Oct. 20, 1994, abandoned.

[30] Foreign Application Priority Data

Oct. 21, 1993 [JP] Japan .................... 5-263240
Feb. 15, 1996 [JP] Japan .................... 8-27179

[51] Int. Cl.⁷ .................... G03B 27/42; G03B 27/54
[52] U.S. Cl. .................... 355/53; 355/67
[58] Field of Search .................... 355/53, 67, 77; 356/399, 400, 401; 250/548

[56] References Cited

U.S. PATENT DOCUMENTS

| | | | |
|---|---|---|---|
| 4,383,757 | 5/1983 | Phillips | 355/53 |
| 4,504,144 | 3/1985 | Trost | 356/150 |
| 4,558,949 | 12/1985 | Uehara et al. | 356/152 |
| 4,669,867 | 6/1987 | Uda et al. | 355/53 |
| 4,676,649 | 6/1987 | Phillips | 356/401 |
| 4,687,322 | 8/1987 | Tanimoto et al. | 355/55 |
| 4,780,617 | 10/1988 | Umatate et al. | 250/548 |
| 4,801,977 | 1/1989 | Ishizaka et al. | 355/30 |
| 4,833,621 | 5/1989 | Umatate | 364/491 |
| 4,999,669 | 3/1991 | Sakamoto et al. | 355/53 |
| 5,003,342 | 3/1991 | Nishi | 355/43 |
| 5,015,866 | 5/1991 | Hayashi | 250/548 |
| 5,114,234 | 5/1992 | Otsuke et al. | 356/358 |
| 5,118,957 | 6/1992 | Kawashima et al. | 250/561 |
| 5,286,963 | 2/1994 | Torigoe | 250/201.2 |
| 5,416,562 | 5/1995 | Ota et al. | 355/53 |
| 5,424,552 | 6/1995 | Tsuji | 250/548 |
| 5,443,932 | 8/1995 | Ohta et al. | 430/22 |
| 5,448,332 | 9/1995 | Sakakibara et al. | 355/53 |
| 5,473,424 | 12/1995 | Okumura | 356/139.03 |
| 5,477,304 | 12/1995 | Nishi | 355/53 |
| 5,521,036 | 5/1996 | Iwamoto | 430/22 |
| 5,710,620 | 1/1998 | Taniguchi | 355/53 |

FOREIGN PATENT DOCUMENTS

5-129185  5/1993  Japan .

*Primary Examiner*—David M. Gray
*Assistant Examiner*—Hung Henry Nguyen
*Attorney, Agent, or Firm*—Vorys, Sater, Seymour and Pease LLP

[57] ABSTRACT

In a projection exposure apparatus and method in which a substrate is exposed with a projected image of a mask through a projection optical system, a table which is movable in a direction of an optical axis of the projection optical system in arranged at an image side of the projection optical system to hold the substrate. A tilt amount of the table is monitored, and position information of a mark on the table is detected, which changes in accordance with the tilt of the table. Information on the relationship between a displacement amount of the substrate and a plane perpendicular to the optical axis and the tilt angle of the substrate is obtained, based on the monitored tilt amount and the position information of the mark.

32 Claims, 8 Drawing Sheets

PROJECTION EXPOSURE APPARATUS AND METHOD

CROSS REFERENCE TO RELATED APPLICATIONS

This application is a continuation of application Ser. No. 08/744,196 filed Nov. 5, 1996 (abandoned), which is a continuation-in-part of application Ser. No. 08/326,398 filed Oct. 20, 1994 (abandoned).

BACKGROUND OF THE INVENTION

1. Field of the Invention

The present invention relates to a projection exposure apparatus for transferring a pattern of a photo mask or a reticle onto a photosensitive substrate, which is employed in a photolithography process of manufacturing, e.g., a semiconductor device, a liquid crystal display device or a thin-film magnetic head, etc.

2. Related Background Art

Recently, an integration degree of the semiconductor device has increased more and more, and making a circuit pattern hyperfine has been demanded. For this purpose, however, it is required that a resolution of the projection exposure apparatus be enhanced. One of methods of enhancing the resolution is to increase a numerical aperture of a projection optical system. If the numerical aperture is increased, however, a focal depth of a projection image decreases. Further, a process of manufacturing the semiconductor device becomes complicated, and there is a tendency of enlarging a level difference within the circuit patterns formed on the wafer. For this reason, an average surface is obtained corresponding to a level-difference structure within the on-the-wafer shot areas onto which the reticle patterns are transferred. The wafer is moved relatively to an imaging surface of the projection optical system corresponding thereto, whereby the entire average surface of the shot areas substantially aligns with the imaging surface of the projection optical system. That is, the entire average surface is set within the focal depth. A conventional projection exposure apparatus is equipped with a focus mechanism for adjusting a position (focus position) of an exposure surface of the wafer in the optical-axis direction of the projection optical system and a tilt mechanism for adjusting a tilt angle of the exposure surface thereof. Hereinafter, an operation of adjusting the tilt angle of the above exposure is termed [leveling].

Figure 3A:
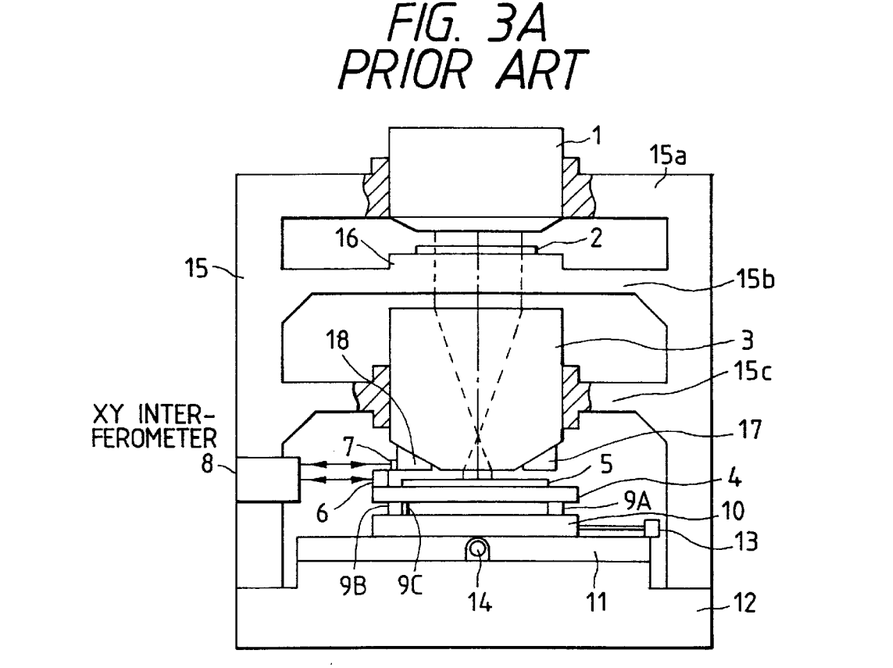
FIGS. 3A and 3B are views showing a construction of a prior art projection exposure apparatus.

FIG. 3A illustrates one example of the conventional projection exposure apparatus. Referring to FIG. 3A, a reticle 2 is illuminated with beams of illumination light from an illumination optical system 1. An image of a pattern on the reticle 2 is transferred onto the shot area on a wafer 5 held on a wafer table 4 via a projection optical system 3. A movable mirror 6 is attached to an edge portion of on the wafer table 4. The movable mirror 6 and an XY interferometer 8 cooperate to measure a position of the wafer table 4 within a plane (hereinafter called an XY plane) perpendicular to the optical axis of the projection optical system 3.

The wafer table 4 is placed on an X-stage 10 through three stretchable/contractible fulcrums 9A–9C composed of piezo-elements or the like. The X-stage 10 is placed on a Y-stage 11. The Y-stage 11 is placed on a base 12. The three fulcrums 9A–9C and a driving unit within the X-stage 10 are combined to constitute a tilt mechanism. The wafer table 4 is tilted by this tilt mechanism, thereby effecting the leveling of the wafer 5. Further, the three fulcrums 9A–9C are stretched and contracted by the same quantity, and a focus position of the wafer 5 is thereby minutely adjusted (focusing). Further, the X-stage 10 is moved through the driving unit 13. The Y-stage 11 is moved through a driving unit 14. Thus, the pattern image of the reticle 2 is exposed on each shot area on the wafer 5.

Further, a gate-shaped column 15 is embedded into the base 12. The illumination optical system 1 is fixed to a first beam 15a of the column 15. A table unit 16 for supporting the reticle 2 is formed on a second beam 15b of the column 15. The projection optical system 3 is fixed to a third beam 15c of the column 15. The XY interferometer 8 is secured to a strut portion of the column 15. The movable mirror 6 is irradiated with a laser beam from the XY interferometer 8, and, at the same time, a reference mirror 7 fixed to a side surface of the projection optical system 3 is also irradiated with the laser beam. Coordinates of the wafer table 4 are thus measured.

Attached further to a side surface of a lower portion of a lens barrel of the projection optical system 3 are an alignment system 17 based on an off-axis method and a surface detection sensor 18 for detecting a position and a tilt angle of the exposure surface of the wafer 5. The alignment system 17 is defined as an optical system for detecting positions of alignment marks on the wafer 5 by, e.g., an image processing method or a method of performing the irradiation of the laser beam for detecting the position. The surface detection sensor 18 is constructed of, as disclosed in, e.g., U.S. Pat. No. 4,558,949, a focus sensor for detecting a deviation quantity from the imaging surface of the projection optical system 3 at a predetermined point on the exposure surface of the wafer 5 and a leveling sensor for detecting the tilt angle of the exposure surface of the wafer 5 with respect to the imaging surface.

Then, hitherto, the exposure surface of the wafer 5 substantially aligns with the imaging surface of the projection optical system 3 by adjusting the stretching/contracting quantities of the fulcrums 9A–9C on the basis of output signals of the surface detection sensor 18. Note that U.S. Pat. Nos. 4,504,144 and 4,676,649 disclose a mechanism for driving the wafer table 4 and one example of a control method thereof.

Figure 3B:
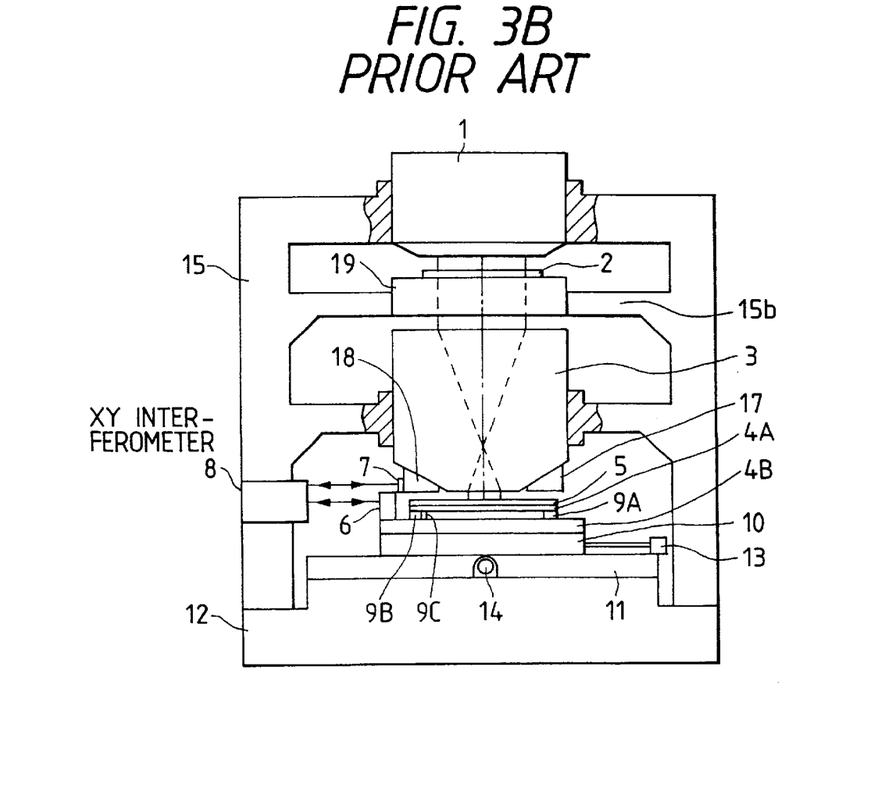

FIG. 3B illustrates another example of the conventional projection exposure apparatus. A different point of this conventional example from the former conventional example of FIG. 3A is that the fulcrums 9A–9C constituting the tilt mechanism are provided on a wafer table 4B. More specifically, referring to FIG. 3B, a wafer table 4B is mounted on the X-stage 10. A wafer holder 4A is placed on the wafer table 4B through the three fulcrums 9A–9C. The wafer 5 is held on this wafer holder 4A. Further, the movable mirror 6 is fixed to one edge of the wafer table 4B. The XY interferometer 8 always measures a position of the wafer table 4B. Other configurations are the same as those in the example of FIG. 3A.

Accordingly, in the conventional example of FIG. 3B, the stretching/contracting quantities of the fulcrums 9A–9C defined as the tilt mechanism are adjusted based on the detected result of the surface detection sensor 18, thereby adjusting a focus position and a tilt angle in such a way that the wafer 5 is integral with the wafer holder 4A. In the conventional example of FIG. 3A, when operating the tilt mechanism, the tilt angle of the movable mirror 6 is also varied. In contrast with this, according to the conventional example of FIG. 3B, even when operating the tilt mechanism, the tilt angle of the movable mirror 6 does not change. This point is a big difference therebetween.

Now, in the case of performing the above-stated leveling, the wafer 5 makes almost no displacement in X- and Y-directions even when the fulcrums 9A–9C are stretched and contracted within a range where a trace quantity of variation in the tilt angle of the wafer 5 is seen. As a matter of fact, however, it may happen that the wafer 5 is shifted by a trace quantity in the X- and Y-directions with the stretch/contraction of the fulcrums 9A–9C due to a backlash and a deformation of the tilt mechanism. If an exposure takes place in a state where the wafer 5 is thus shifted in the X- and Y-directions, an overlay accuracy of the projected image of the pattern of the reticle 2 with respect to the shot area on the wafer 5 drops down, resulting in such a disadvantage that a yield is deteriorated.

Especially in the conventional example of FIG. 3B, the movable mirror 6 and the fulcrums 9A–9C are fixed onto the wafer table 4B, and, hence, the XY interferometer 8 is incapable of measuring the X- and Y-directional deviation quantities of the wafer 5 that are caused due to the stretch and contraction of the fulcrums 9A–9C. This is a factor for deteriorating the locating accuracy.

On the other hand, in the conventional example of FIG. 3A, there is no movable portion between the movable mirror 6 and the wafer 5. The XY interferometer 8 is capable of detecting the X- and Y-directional deviation quantities of the wafer 5 that are produced due to the backlash and deformation of the tilt mechanism. In the configuration of FIG. 3A, however, the X- and Y-directional deviation quantities are inevitably produced in terms of the system configuration in addition to the backlash and deformation of the tilt mechanism. This deviation quantity is classified into the following four error components.

(1) Interferometer-cosine Error

The movable mirror 6 is tilted, and the optical path of the laser beam of the XY interferometer 8 is consequently tilted. This error is caused due to a variation in terms of a relationship between a read value of the XY interferometer 8 and an intra XY-plane position of the wafer 5.

(2) Abbe Error

This error is caused by effecting the leveling in a state where a Z-directional position of the laser beam of from the XY interferometer 8 is different from a Z-directional position of the exposure surface of the wafer 5, i.e., in a state where the laser beam from the XY interferometer 8 does not satisfy the Abbe condition in the Z-direction.

(3) Wafer-cosine Error

This error is produced due to a variation in length of a line segment obtained by projecting a line segment from the movable mirror 6 to an exposure position on the wafer 5 onto the XY plane, which variation occurs with the leveling operation.

(4) Movable Mirror Tilt Error

If a reflecting surface of the movable mirror 6 is set with a tilt to the wafer table 4 (or 4B) from the perpendicular plane, this error is caused due to a variation in distance from a reflecting point of the laser beam from the movable mirror 6 to the exposure position on the wafer with a Z-directional displacement of the movable mirror 6 when effecting the leveling.

Magnitudes of the above error factors are minute enough not to present a problem hitherto. However, with an advancement of a hyperfine structure in terms of design rules of the semiconductor device, etc., these magnitudes thereof are not ignorable any more. The magnitudes of these error factors change depending on a variation quantity of the tilt angle due to the leveling, the tilt angle of the movable mirror 6 with respect to the wafer table 4 (or 4B), a distance from the movable mirror 6 to the exposure shot, a length of the optical path of the XY interferometer 8 and an Abbe offset quantity (deviation quantity which is a factor of the Abbe error) of the exposure surface of the wafer with respect to the XY interferometer 8. Error quantities based on those error factors are obtainable by calculation, and, therefore, after completing the leveling operation and the locating within the XY plane of the wafer 5, those error quantities can be corrected by minutely adjusting the X- and Y-directional positions of the wafer table 4 (or 4B). This, however, implies nothing but to locate the wafer table 4 (or 4B) at two stages, which is undesirable because of decreasing a throughput of the exposure process.

Further, when the travel guide surface of XY-stage has undulations, and the XY-stage is driven, a movable mirror on a focus leveling stage may be tilted, which is so-called rolling and pitching. Also in this case, a measured value by a laser interferometer undesirably includes a so-called Abbe error.

If the exposure of circuit patterns is repeated with the Abbe error, a proper locating accuracy is not ensured. A semiconductor integrated circuit with a higher integration degree cannot be manufactured.

SUMMARY OF THE INVENTION

It is a primary object of the present invention to eliminate error factors such as a backlash and a deformation caused in an unviewable portion of a tilt mechanism when performing an adjustment (leveling) of a tilt angle of a substrate and, at the same time, enhance an overall locating accuracy without decreasing a throughput by correcting X- and Y-directional deviation quantities inevitably produced in terms of a system configuration when effecting the leveling operation.

To accomplish the above object, according to one aspect of the present invention, there is provided a projection exposure apparatus comprising: an illumination system for illuminating a mask with the light; a projection optical system for projecting an image of a pattern on a mask onto a substrate; a first detection system for detecting a tilt angle of an exposure surface (e.g., an external surface) of the substrate; a table for holding the substrate; a tilt mechanism for adjusting a tilt angle of the table; a substrate stage for moving the table on a first plane substantially perpendicular to an optical axis of the projection optical system; a second detection system for detecting the tilt angle of the table with respect to the first plane; a substrate-side measuring instrument for measuring two-dimensional positions of the table on the first plane; a mask stage for moving the mask on a second plane substantially perpendicular to the optical axis of the projection optical system; a mask-side measuring instrument for measuring two-dimensional positions of the mask stage on the second plane; and a controller for controlling operations of the tilt mechanism, the substrate stage and the mask stage on the basis of detected results of the first detection system, the second detection system, the substrate-side measuring instrument and the mask-side measuring instrument. In this case, the controller may, when adjusting the tilt angle of the substrate through the tilt mechanism on the basis of the detected result of the first detection system, adjust a position of the mask stage on the basis of a difference between the detected results of the second detection system and the substrate-side measuring instrument before operating the tilt mechanism and the detected results of the second detection system and the substrate-side measuring instrument after operating the tilt mechanism.

According to the present invention, a locating error can be corrected by making a micromotion of, e.g., the mask with respect to a movement of the substrate within the first plane (which is defined as an XY plane) that is caused by the leveling of the substrate. The following is one example of an exposure operation by the projection exposure apparatus according to the present invention.

To start with, the substrate stage is driven by use of a measured value of the substrate-side measuring instrument so that a predetermined shot area on the substrate is set in an exposure position just under the projection optical system. Next, the first detection system detects the tilt angle of the exposure surface of this shot area. The tilt mechanism is driven based on this tilt angle so that the exposure surface of the shot area aligns with an image surface of the projection optical system. At this time, a position of the substrate stage is controlled so as not to change the measured value of the substrate-side measuring instrument. In this instance also, the substrate is, as will be stated later, shifted by a predetermined quantity in the X- and/or Y-direction by driving the tilt mechanism. Hence, a mask position is corrected by driving the mask stage so as to correct an alignment error due to this shift. Thereafter, the mask pattern image is transferred onto the substrate. Then, the above operation is repeatedly performed with respect to the respective shot areas on the substrate.

Given next are descriptions about the X- and Y-directional deviation quantities of the substrate that are produced when driving the tilt mechanism and a method of correcting these deviation quantities. Hereinbelow, the deviation quantity for one axis in the X-direction will be explained. The Y-directional deviation quantity and the correcting method are the same. Further, the substrate-side measuring instrument will be described in the form of an interferometer based on a double-path method by which the laser beam is reciprocated substantially twice between the movable mirror fixed to one edge of the table and a corner-cube prism. As already explained, the substrate X-directional deviation quantity produced by driving the tilt mechanism is a sum of the (1) interferometer-cosine error, (2) the Abbe error, (3) the wafer-cosine error and (4) the movable mirror tilt error.

Figure 2A:
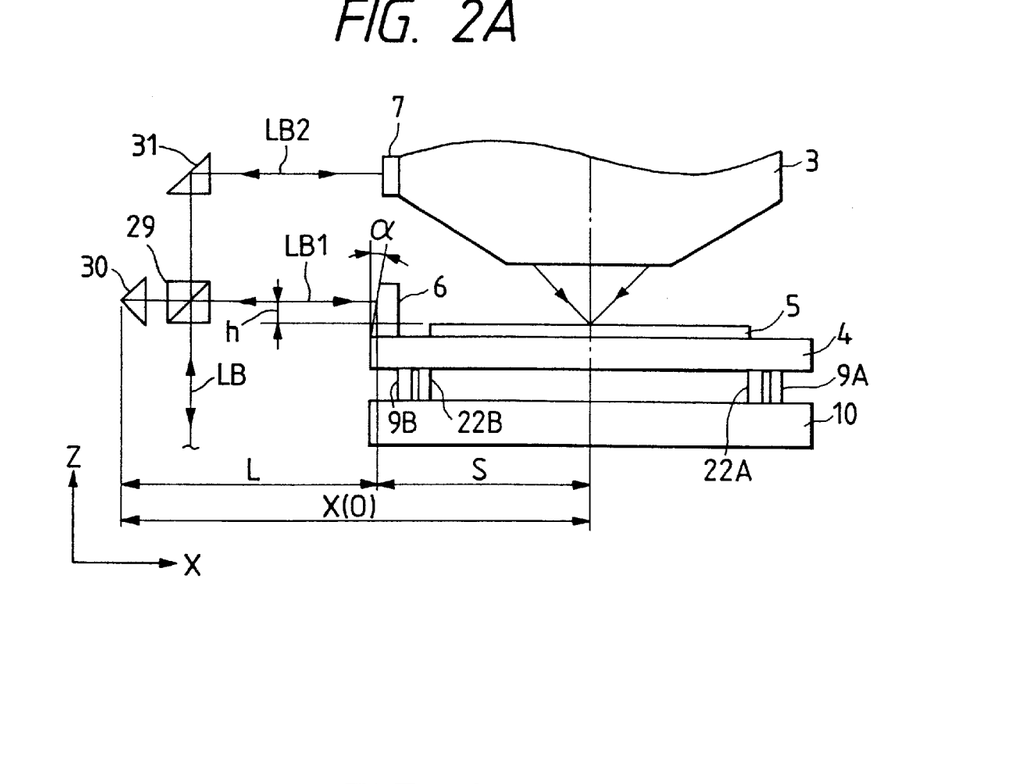
FIGS. 2A and 2B are views of assistance in explaining an X-directional deviation quantity of a wafer that is produced in terms of a system configuration when effecting the leveling in the apparatus of FIG. 1.
Figure 2B:
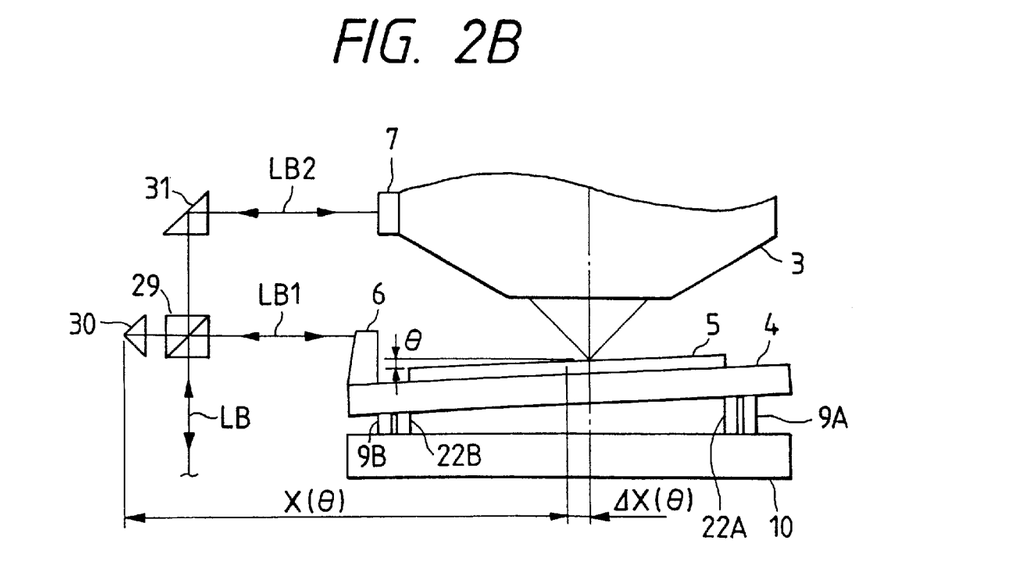

FIGS. 2A and 2B are explanatory views showing the deviation quantity by way of this total quantity. FIG. 2A illustrates a case where the exposure surface of the substrate (5) on the table (4) is parallel to a laser beam (LB1) incident on the movable mirror (6). FIG. 2B shows a state where the table (4) rotates through an angle $\theta$ from the state of FIG. 2A. Referring to FIG. 2A, let h be the difference between the optical path of the laser beam (LB1) from the interferometer and a level (focus position) of the exposure surface, i.e., the Abbe offset quantity, and let s be the distance from the reflecting point of the movable mirror (6) to the center of the exposure shot. Let a be the tilt angle of the reflecting surface of the movable mirror (6), and let L be the distance of the optical path from the apex of the corner-cube prism of the interferometer to the movable mirror (6).

Further, let X(0) be the X-directional position of the center of the exposure shot on the substrate (5) on the basis of the corner-cube prism (30) when the angle $\theta$ is 0 as shown in FIG. 2A. Then, let $X(\theta)$ be the X-directional position of the center of the exposure shot on the wafer (5) when controlling a position of the X-stage (10) so as not to change the measured values of the XY interferometer while the wafer table (4), as shown in FIG. 2B, rotates through the angle $\theta$ with the aid of the tilt mechanism (9A, 9B). In this case, a deviation quantity $\Delta X(\theta)$ conceived as a difference in the X-directional position of the center of the exposure shot between these two states, i.e., $X(\theta)-X(0)$ is given as a sum of the error factors shown in the above four items by the following formula:

$$\Delta X(\theta) = X(\theta) - X(0) \quad (1)$$
$$= \{\alpha - (1/2)\theta\}(s + 2L)\theta - h \cdot \theta$$

In the formula (1), the error factors of the above items (1)–(4) go as follows. Note that these error quantities are quantities when using the interferometer by the double-path method.

$$\text{Interferometer Cosine Error} = (1/2) \cdot 2(L - L/\cos\theta) \quad (2)$$
$$\cong -L \cdot \theta^2$$

$$\text{Abbe Error} = -h \cdot \theta \quad (3)$$

$$\text{Wafer Cosine Error} = s\{1 - (1/\cos\theta)\} \quad (4)$$
$$\cong -(1/2)s \cdot \theta^2$$

$$\text{Movable Mirror Tilt Error} = \alpha \cdot (s + 2L)\theta \quad (5)$$

Herein, the angle $\theta$ can be detected by the second detection system (22A, 22B) after locating the substrate and effecting the leveling. Also, the tilt angle a of the movable mirror (6) is a constant determined when assembling the apparatus and may be therefore measured beforehand. Further, the distances s and L are variables varying per exposure shot area within the substrate but can be obtained from a shot array of the substrate and the measured values of the interferometer including the movable mirror (6). The Abbe offset quantity h is also a constant determined when assembling the apparatus and may be previously measured. As a matter of fact, the level (focus position) of the exposure surface of the substrate fluctuates interlocking with up-and-down movements of the image surface of the projection optical system with fluctuations in the atmospheric pressure, and the Abbe offset quantity h also fluctuates. The Abbe offset quantity h can be, however, accurately managed in consideration of the fluctuations of the image surface of the projection optical system.

A quantity obtained by dividing the deviation quantity $\Delta X(\theta)$ by the projection magnification $\beta$, i.e., the $\Delta X(\theta)/\beta$ is corrected by moving, e.g., the mask stage (25).

Note that the position of the substrate stage may be corrected by $\Delta X(\theta)$ instead of correcting the position of the mask stage as explained above. However, in the projection exposure apparatus, the mask stage can be made smaller in stroke than the substrate stage. Besides, the mask stage is small in weight, and a respondency can be increased. Hence, the method of correcting the position of the mask stage is more advantageous in terms of the throughput than in the correction by use of the substrate stage. Moreover, generally the projection magnification $\beta$ is, e.g., ⅕ or ¼ and is therefore considerably smaller than 1. Hence, correcting the position of the mask stage is not more strict in terms of the locating accuracy demanded.

According to the present invention, the first detection system directly measures the position of the table for holding the substrate, and, hence, it is possible to precisely measure the positional deviation quantity of the table (substrate) when adjusting the tilt angle of the substrate, i.e., the error due to the backlash and deformation produced in the unviewable portion such an internal mechanism of the tilt mechanism. Further, the second detection system monitors the tilt angle of the table all the time, and it is therefore feasible to obtain the deviation quantity within the plane substantially perpendicular to the optical axis of the projection optical system by the calculation, which deviation is caused in terms of the system configuration with a tilt of the table. Accordingly, the deviation quantity is corrected by driving the substrate stage and/or the mask stage, whereby an improvement of the locating accuracy can be expected. Furthermore, making the above correction by driving the mask stage exhibits a good controllability and is more advantageous in terms of the throughput than in the correction through the substrate stage. Also, when applied to a reduction projection type exposure apparatus, the mask stage has a larger moving quantity, and hence there is such a advantage that the locating accuracy can be enhanced on the whole even with the same control accuracy.

According to another aspect of the present invention, there is provided an exposure apparatus comprising: an actuator for tilting a leveling stage by a predetermined angle with respect to an optical axis of a projection lens; a movable mirror mounted on the leveling stage; a laser interferometer for irradiating a leaser beam on the movable mirror to obtain a coordinate value; an alignment sensor for detecting an alignment mark; a main control section for reading the coordinate value from the laser interferometer in a state where a wafer is tilted by the actuator, and calculating an Abbe error caused in accordance with a tilt angle of the wafer while confirming the alignment mark with the alignment sensor; and a plane-parallel glass for adjusting a measurement position of the laser interferometer in an optical-axis direction of the projection lens.

With this arrangement, an Abbe error is calculated using the tilt angle θ of this stage and the coordinate value obtained by the laser interferometer, and the measurement position of the laser interferometer can be adjusted so as not to cause the Abbe error by virtue of the plane-parallel glass. Therefore, coordinates can be obtained with a high locating accuracy.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
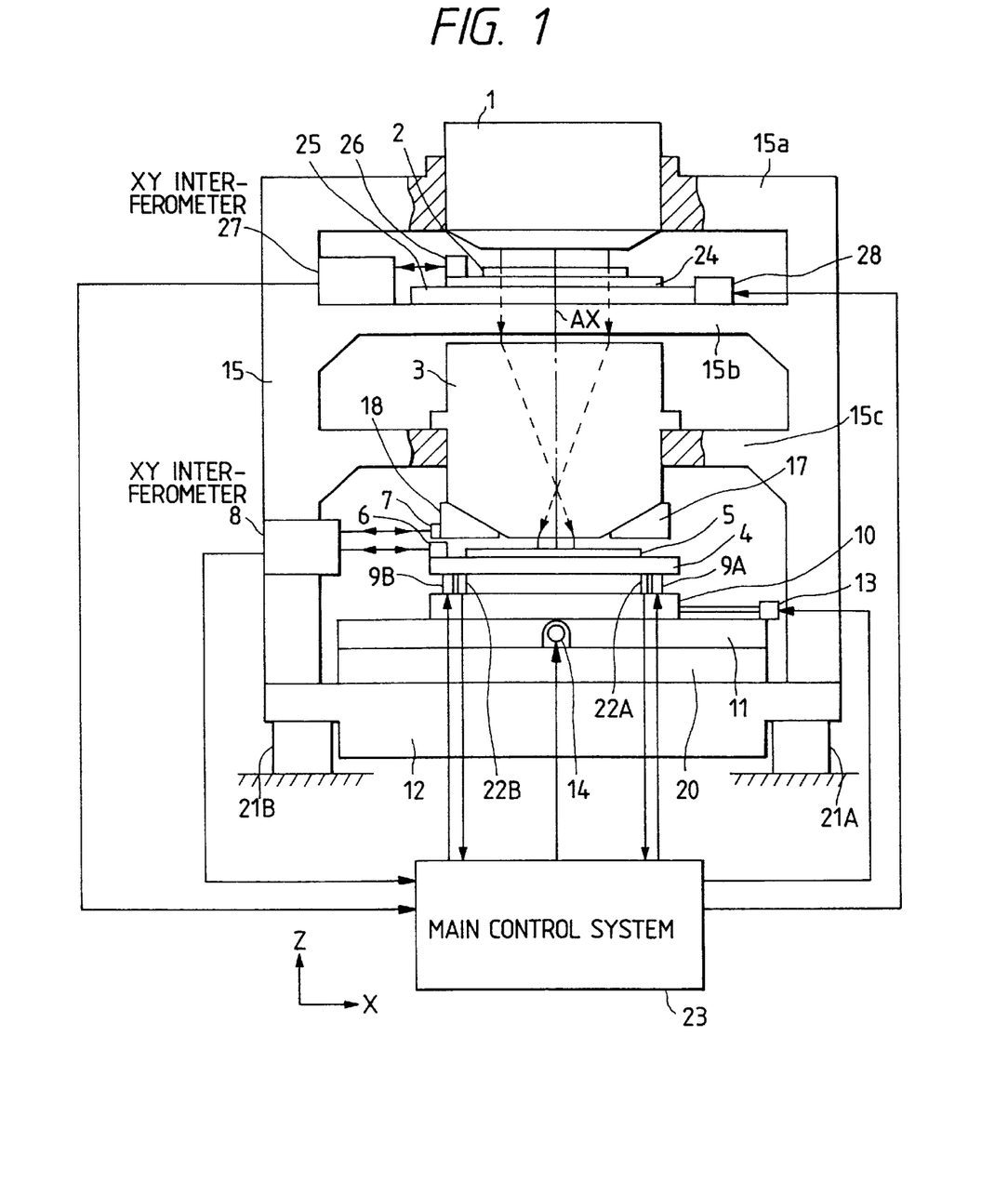
FIG. 1 is a view schematically illustrating a construction of a projection exposure apparatus in one embodiment of the present invention.

A projection exposure apparatus in accordance with one embodiment of the present invention will hereinafter be described with reference to FIGS. 1, 2A and 2B. Referring first to FIG. 1, components corresponding to those in FIG. 3A are marked with the same numerals, and detailed explanations thereof will be omitted.

Referring again to FIG. 1, a reticle 2 is illuminated with beams of light from an illumination optical system 1 with a substantially uniform illuminance. Images of patterns on the reticle 2 are projected on respective shot areas of a wafer 5 placed on a wafer table 4 via a projection optical system 3. A Z-axis is taken in parallel to an optical axis AX of the projection optical system 3. An X-axis is taken perpendicularly to the Z-axis but in parallel to the sheet surface of FIG. 1. A Y-axis is taken perpendicularly to the X-axis but in a direction perpendicular to the sheet surface of FIG. 1.

The reticle 2 is held on a reticle table 24 which is fixed onto an XY-stage 25. The XY-stage 25 is mounted on a second beam 15b of a column 15 and movable within an XY plane perpendicular to the optical axis AX of the projection optical system 3. A movable mirror 26 for reflecting laser beams from an XY interferometer 27 fixed onto the beam 15b is fixed to an edge portion on the reticle table 24. The XY interferometer 27 always measures a position of the reticle table 24 (and, in turn, the reticle 2) within the XY plane. A result of this measurement is supplied to a main control system 23 for controlling the operation of the whole apparatus. The main control system 23 drives the XY-stage 25 in X- and Y-directions through an actuator 28 fixed onto the beam 15b, thereby setting the reticle 2 in a desired position within the XY plane.

On the other hand, the wafer 5 is held on the wafer table 4. The wafer table 4 is mounted on an X-stage 10 through three stretchable/contractible fulcrums (e.g., piezo-elements) 9A, 9B, 9C (but the piezo-element 9C is not shown) constituting a tilt mechanism. Further, the X-stage 10 is mounted on the Y-stage 11. The Y-stage 11 is fixed onto a base 12 through a fixed stage 20. The base 12 is placed on the floor through vibro-isolating pads 21A, 21B, which arrangement prevents vibrations from being conveyed directly to the base 12.

Laser beams from an XY interferometer 8 fixed within the column 15 are reflected by the movable mirror 6 fixed onto the wafer table 4. The XY interferometer 8 always measures a position of the wafer 5 within the XY plane as a relative distance between a reference mirror 7 and the movable mirror 6. A result of this measurement is supplied to the main control system 23. The main control system 23 drives the X- and Y-stages 10, 11 through driving units 13, 14, thereby locating the wafer 5 in a desired position within the XY plane.

A surface detection sensor 18 disposed at a lower portion of a lens barrel of the projection optical system 3 measures states of ruggedness and a tilt of an exposure surface of the wafer 5. The surface detection sensor 18 in this embodiment is constructed of, e.g., a leveling sensor and an oblique incident light type focus sensor disclosed in U.S. Pat. No.

4,558,949. The main control system 23 is supplied respectively with a focus signal (indicating a focus position at a predetermined measuring point on the exposure surface of the wafer 5) obtained by the focus sensor and a tilt angle signal (indicating an average tilt angle of the exposure surface of the wafer 5) obtained by the leveling sensor. The main control system 23 independently adjusts a stretching/contracting quantity of each of the fulcrums 9A–9C through the driving units within the X-stage 10 so that each of the focus signal and the tilt angle signal reaches a predetermined fiducial value. The exposure surface of the shot area, which is going to be exposed, on the wafer 5 is aligned with an imaging surface (conjugate surface of the reticle 2 with respect to the pattern forming surface) of the projection optical system 3.

Further, in accordance with this embodiment, level sensors 22A, 22B, 22C (but the sensor 22C is not illustrated in FIG. 1) for independently measuring the stretching/contracting quantities of the three fulcrums 9A, 9B, 9C are provided between the wafer stage 4 and the X-stage 10. The main control system 23 is supplied with respective measured values of the three level sensors 22A–22C. The main control system 23 is capable of calculating a tilt angle of the wafer table 4 itself from the measured values of the three level sensors 22A–22C. Accordingly, when changing the tilt angle (containing bidirectional components) of the wafer table 4 by adjusting the stretching/contracting quantities of the fulcrums 9A–9C, the main control system 23 is capable of recognizing how the tilt angle of the wafer table 4 is actually changed. Other configurations are the same as those in FIG. 3A.

Given next is a discussion of one example of the operation when exposed in accordance with this embodiment. To start with, the main control system 23 drives the X- and Y-stages 10, 11 by use of the measured values of the XY interferometer 8, thereby setting a predetermined shot area of the wafer 5 in an exposure position within an exposure field of the projection optical system 3. Note that when transferring a 1st-layered reticle pattern onto the wafer, each shot area on the wafer 5 is located in the exposure position (projection position of the reticle pattern) in accordance with in-terms-of-design array coordinates of the shot areas on the wafer. On the other hand, when transferring a 2nd-layered reticle pattern onto the wafer, each shot area on the wafer 5 is located in the exposure position by adopting an alignment method disclosed in, e.g., U.S. Pat. No. 4,780,617.

Furthermore, the control system 23 detects a tilt angle and a focus position of the shot area, onto which the pattern of the reticle 2 is to be transferred, on the wafer 5 by use the surface detection sensor 18. The control system 23 adjusts the stretching/contracting quantities of the fulcrums 9A–9C so that the focus position and the tilt angle thereof are substantially identical with a focus position and a tilt angle of the imaging surface of the projection optical system 3. At this time, the main control system 23 drives the X- and Y-stages 10, 11 to control the position thereof so that the measured values of the XY interferometer 8 do not change even when the fulcrums 9A–9C stretch and contract.

By the way, as explained above, even though the X-and Y-stages 10, 11 are driven based on the measured values of the XY interferometer 8, the position of the exposure target shot area on the wafer 5 is, as will be stated later, shifted by a predetermined quantity in the X- and Y-directions with the driving of the fulcrums 9A–9C. Then, the position of the reticle 2 is corrected by driving the XY-stage 25 so that this shift quantity (i.e., an alignment error between a projected image of the pattern of the reticle 2 and the shot area on the wafer 5) is reduced down to zero. Thereafter, the pattern image of the reticle 2 is exposed on the shot area on the wafer 5 via the projection optical system 3. The operation described so far is repeated with respect to each of the shot areas on the wafer 5.

Given next is a discussion on X- and Y-directional deviation quantities of the wafer 5 that are caused when driving the fulcrums 9A–9C in this embodiment. The X-directional deviation quantity for one axis will be explained hereinbelow. The Y-directional deviation quantity is, however, the same. Further, the XY interferometer 8 is explained by way of an interferometer based on a double-path method.

FIG. 2A illustrates configurations of the XY interferometer 8 and a wafer-side stage system. Referring to FIG. 2A, laser beams LB from an unillustrated laser light source are incident on a beam splitter 29 in the XY interferometer 8. The laser beams LB are composed of a laser beam LB1 and a laser beam LB2 that have frequencies slightly different from each other. The laser beams LB1, LB2 are respectively s- and p-polarized light beams with respect to the polarizing beam splitter 29.

Now, the laser beam LB1 (s-polarized light beam) is reflected by the polarizing beam splitter 29 and travels toward the movable mirror 6 via an unillustrated quarter-wave plate. The laser beam LB1 reflected by the movable mirror 6 again travels through the quarter-wave plate and turns out the p-polarized light beam. The laser beam LB1 then penetrates the polarizing beam splitter 29 and travels toward a corner-cube prism 30. The laser beam LB1 reflected by the corner-cube prism 30 again travels toward the movable mirror 6 via the polarizing beam splitter 29 and the quarter-wave plate as well. Further, the leaser beam LB1 reflected by the movable mirror 6 again passes through the quarter-wave plate and turns out the s-polarized light beam. The laser beam LB1 is then reflected by the polarizing beam splitter 29 and returns in an incidence direction.

On the other hand, the laser beam LB2 (p-polarized light beam) penetrates the polarizing beam splitter 29 and thereafter travels toward the reference mirror 7 via a triangular prism 31 and the unillustrated quarter-wave plate. The laser beam LB2 reflected by the reference mirror 7 again passes through the triangular prism 31 and the quarter-wave plate and thus turns out the s-polarized light beam. The laser beam LB2 is reflected by the polarizing beam splitter 29 and travels toward the corner-cube prism 30. The laser beam LB2 reflected by the corner-cube prism 30 is again reflected by the polarizing beam splitter 29 and travels toward the reference mirror 7 via the triangular prism 31 and the quarter-wave plate. The leaser beam LB2 further reflected by the reference mirror 7 passes through the triangular prism 31 and the quarter-wave plate and thus turns out the p-polarized light beam. The laser beam the penetrates LB2 then polarizing beam splitter 29 and travels back in the incidence direction. The XY interferometer 8 detects a relative displacement quantity between the reference mirror 7 and the movable mirror 6 according to the double-path method from beat signals obtained by photoelectrically converting the interference light of the two laser beams LB1, LB2 returned in the incidence direction.

In accordance with this embodiment, with respect to the X-directional deviation quantity of the wafer 5 that is caused due to the driving of the fulcrums 9A–9C, a deviation quantity of the exposure surface of the wafer 5 from the center of rotation of the tilt mechanism including the fulcrums 9A–9C and a deviation quantity derived from a backlash of the tilt mechanism are corrected by tilting the wafer table 4 while keeping constant the measured values of the XY interferometer 8. As already explained, however, even when the measured values of the XY interferometer 8 are kept constant, there remains an error quantity as a total of (1) an interferometer cosine error, (2) an Abbe error, (3) a wafer cosine error and (4) a movable mirror tilt error.

FIG. 2A illustrates a case where the exposure surface of the wafer 5 on the wafer table 4 is parallel to the laser beam LB1 incident on the movable mirror 6. FIG. 2B shows a state where the wafer table 4 rotates through an angle θ from the state of FIG. 2A. Referring to FIG. 2A, let h be the difference between an optical path of the laser beam LB1 when incident on the movable mirror 6 and a level (focus position) of the exposure surface of the wafer 5, i.e., the Abbe offset quantity. Let s be the distance from the reflecting point of the movable mirror 6 to the center of the exposure shot, and let a be the tilt angle of the movable mirror 6 with respect to the Z-axis of the reflecting surface. Let also L be the distance of an optical path from the apex of the corner-cube prism 30 to the movable mirror 6.

Further, let X(0) be the X-directional position of the center of the exposure shot on the wafer 5 on the basis of the corner-cube prism 30 when the angle θ is 0 as illustrated in FIG. 2A. Then, let X(θ) be the X-directional position of the center of the exposure shot on the wafer 5 when controlling a position of the X-stage 10 so as not to change the measured values of the XY interferometer 8 while the wafer table 4, as shown in FIG. 2B, rotates through the angle θ with the aid of the fulcrums 9A–9C. In this case, a deviation quantity ΔX(θ) conceived as a difference in the X-directional position of the center of the exposure shot between these two states, i.e., X(θ)–X(0) is given as a sum of error quantities shown in the above four items by the following formula:

$$\Delta X(\theta) = X(\theta) - X(0) \quad (6)$$
$$= \{a - (1/2)\theta\}(s + 2L)\theta - h \cdot \theta$$

Accordingly, let β be the projection magnification of the projection optical system 3 from reticle 2 onto the wafer 5, and the XY-stage 25 is moved by −ΔX(θ)/β in the X-direction. A projected image of the pattern of the reticle 2 thereby deviates by ΔX(θ) on the wafer 5 in the X-direction, and the above four errors are eliminated. In this instance, a value of the projection magnification β is, e.g., ⅕, etc., and hence it is possible to perform an alignment between the reticle 2 and the wafer 5 with an accuracy higher than the control accuracy of the X-directional moving quantity of the XY-stage 25.

Described next is a method of correcting the deviation quantity ΔX(θ) in the formula (6) given above when effecting the alignment by use of an alignment system 17 based on the off-axis method of FIG. 1. In general, when exposing the pattern image of the reticle 2 on a chip pattern already formed in each shot area on the wafer 5, alignment marks for aligning are formed in these respective shot areas. Then, for example, the die-by-die alignment (hereafter abbreviated to DDA) method is to be adopted. A position of the alignment mark is detected per shot area by use of the alignment system 17. Based on the detected position, each shot area is located in the exposure position within the exposure field of the projection optical system 3. On this occasion, if the exposure is effected on each shot area in a state where the wafer table 4 is tilted (that is, a state where the angle θ is not 0 as shown in FIG. 2B), the position of each shot area that is detected by the alignment system 17 is corrected by the deviation quantity ΔX(θ) obtained in the formula (6). Based on a result of this correction, the X- and Y-stages 10, 11 are driven to locate each shot area on the wafer 5. With this operation, there is eliminated the necessity for especially driving the XY-stage 25.

Further, it is feasible to take not the die-by-die alignment method but, as disclosed in, e.g., U.S. Pat. Nos. 4,780,617 and 4,833,621, a so-called enhanced global alignment (hereinafter abbreviated to EGA) method of obtaining array coordinates of all the shot areas on the wafer by the least squares method, this involving such a step that the alignment system 17 detects coordinates of three or more shot areas preselected from all the shot areas on the wafer 5. In the case of taking the EGA method also, as discussed above, the correction of the deviation quantity ΔX(θ) obtained in the formula (6) may be added to the array coordinates obtained by the calculation. This eliminates the necessity for driving the XY-stage 25.

In any of the DDA method and the EGA method explained above, the X- and Y-stages 10, 11 are located to give an offset corresponding to the deviation quantity ΔX(θ). As in absolutely the same way with the above-discussed embodiment, however, the deviation quantity ΔX(θ) may be corrected by driving the XY-stage 25.

Note that the level detection sensors 22A–22C for detecting the tilt angle of the wafer table 4 are provided between the wafer table 4 and the X-stage 10 in accordance with this embodiment. The following construction may also be, however, adopted. A plurality of interferometers for detecting Z-directional positions at different points on the wafer table are arranged in parallel to the optical axis AX of the projection optical system 3. The tilt angle of the wafer table 4 may be measured from a difference between measured values of the plurality of interferometers. If this construction is adopted, an influence by a running straightness (pitching) of each of the X- and Y-stages 10, 11 can be removed, thereby making it possible to realize a higher accuracy locating correction.

Normally in the projection exposure apparatus, an assembly and an adjustment are made so that the plane including respective length measuring beams traveling toward the movable mirror on the stage from the XY interferometer aligns with the imaging surface of the projection optical system. The imaging surface, however, shifts in the optical-axis direction, corresponding to a variation in environmental conditions (atmospheric pressure, temperature, etc.) and a heat accumulation quantity of the projection optical system in connection with an absorption of the exposure light. Then, as disclosed in, e.g., U.S. Pat. Nos. 4,687,322 and 4,801,977, a variation quantity of the imaging surface (best focus surface) which corresponds to the environment conditions and the heat accumulation quantity is sequentially calculated. Focalization of the wafer 5 is performed by use of the surface detection sensor 18 (particularly, focus sensor) in accordance with this calculated value.

For this purpose, in the above-discussed embodiment, the main control system 23 sequentially calculates the variation quantity of the imaging surface. Based on this calculated value, it is preferable that a value of the Abbe offset quantity h is obtained, and the crosswise deviation quantity ΔX(θ) of the wafer may be corrected from the formula (6). Further, instead of driving the reticle stage 25, the wafer stages 10, 11 are driven so that the output of the interferometer has an offset corresponding to the deviation quantity ΔX(θ). Thus, a deviation (alignment error) between the reticle 2 and the wafer 5 when leveling is done may be corrected. Also, the deviation quantity ΔX(θ) in the formula (6) may be corrected by driving both of the reticle stage 25 and the wafer stages 10, 11.

In the embodiment discussed above, there is employed the surface detection sensor 18 constructed of the combination of the leveling sensor and the focus sensor that are disclosed in U.S. Pat. No. 4,558,949. The construction of the surface detection sensor 18 is not confined to this but may involve the use of a multi-point focus sensor, disclosed in, e.g., U.S. Pat. No. 4,383,757 and 5,118,957 or U.S. application Ser. No. 003,451 (filed Jan. 12, 1993) by the present applicant, for irradiating the shot areas on the wafer with a plurality of slit (or pinhole) images. Alternatively, as disclosed in U.S. application Ser. No. 090,596 (filed Jul. 12, 1993), there may be employed a sensor for projecting a bright-and-dark pattern substantially on the entire surface of the shot area on the wafer and thus detecting a focus position at an arbitrary point within the shot area from a position of the bright-and-dark pattern image on the imaging device.

Note that the present invention is not limited to the embodiments discussed above but may, as a matter of course, take a variety of configurations without deviating from the scope of the gist of the present invention.

Figure 4:
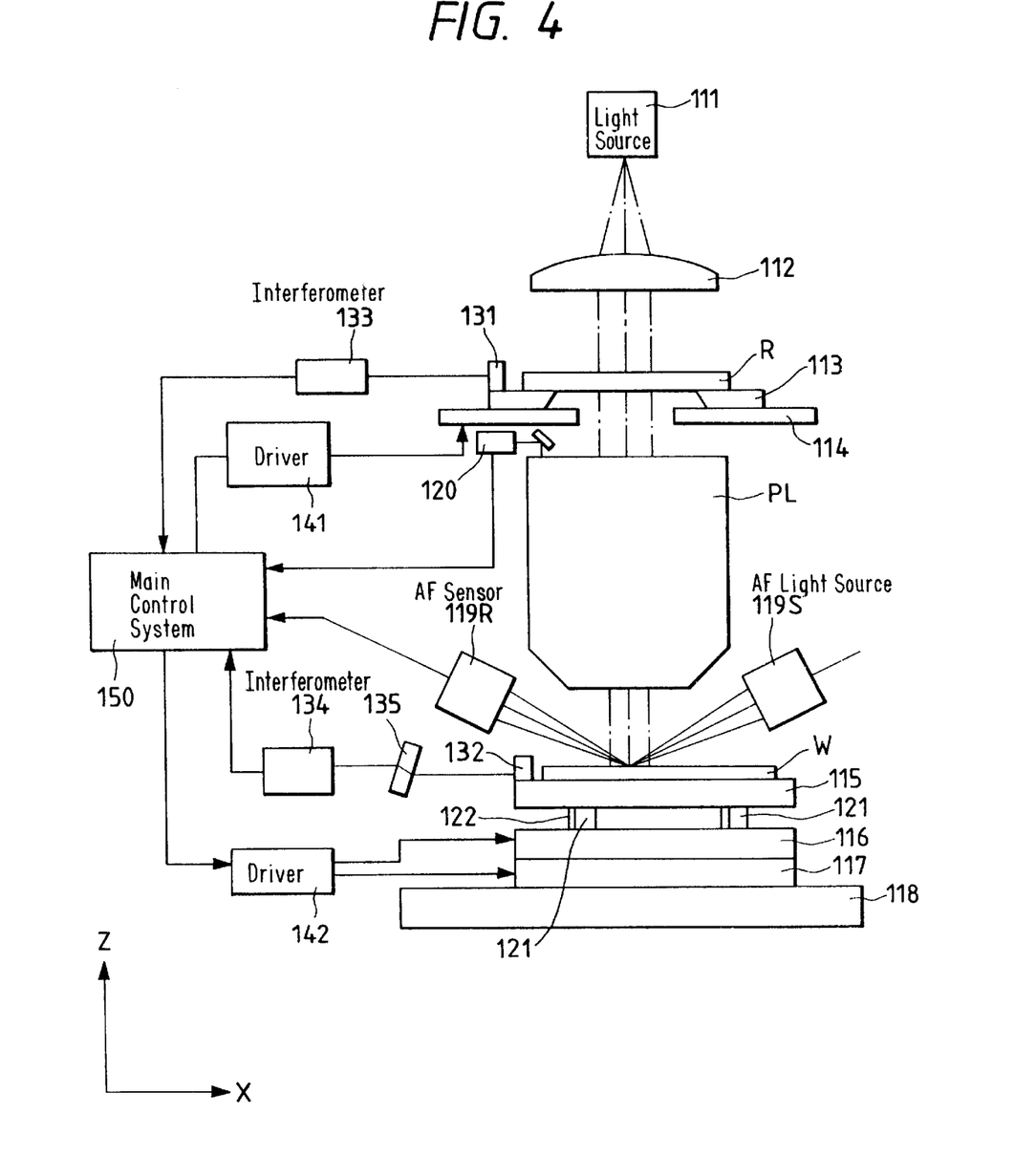
FIG. 4 is a view of the whole arrangement of a scanning type projection exposure apparatus in another embodiment.

FIG. 4 shows a projection exposure apparatus of a step-and-scan method (to be referred to as a scanning type hereinafter) according to another embodiment. A Z-axis is taken in parallel to the optical axis of a projection lens PL. An X-axis is taken in parallel to the sheet surface of FIG. 4 within the two-dimensional plane perpendicular to the optical axis. A Y-axis is taken in a direction perpendicular to the sheet surface of FIG. 4.

Referring to FIG. 4, exposure illumination light from a light source 111 illuminates a slit illumination area on a pattern formation surface of a reticle R through a condenser lens 112 with a uniform illuminance distribution. A pattern within the illumination area on the reticle R is projected and exposed as a slit image on a wafer W applied with a photoresist through the projection lens PL. The reticle R is held on a reticle stage 113, and the reticle stage 113 is mounted on a reticle base 114. The reticle stage 113 is driven by, e.g., a linear motor on the reticle base 114 in the scanning direction (X-direction). The X-coordinate of the reticle R is measured by a movable mirror 131 and a laser interferometer 133 on the reticle stage 113, and this X-coordinate is supplied to a main control system 150 for supervising and controlling the whole operation of the apparatus. Although not shown, a movable mirror and an interferometer are also provided for the Y-coordinate, similar to the X-coordinate. The main control system 150 controls the position and travel speed of the reticle R through a reticle stage driving circuit 141 and the reticle stage 113.

The wafer W is held on a focus leveling stage 115 through a wafer holder (not shown). The focus leveling stage 115 is mounted on a Y-stage 116 through three actuators 121 (only two are illustrated in FIG. 4) which are movable in the Z-direction. The displacement of each actuator is measured by an encoder 122 attached thereto. The Y-stage 116 is mounted on an X-stage 117. The Y-stage 116 and the X-stage 117 are held by air bearings and mounted on a base 118 so as to be moved by, e.g., linear motors in the X- and Y-directions.

Movable mirrors 132 (132X, 132Y) for the X- and Y-axes are fixed to upper ends of the focus leveling stage 115. Laser beams from laser interferometers 134 (134X, 134Y) mounted on the base 118 are irradiated on the movable mirrors 132 to always monitor the X- and Y-coordinates (within a plane orthogonal to the optical axis of the projection lens PL) of the wafer W. Transparent plane-parallel plates 135 are respectively arranged between the movable mirrors 132 and the laser interferometers 134, and the details thereof will be described later.

The main control system 150 controls the operations of the Y- and X-stages 116 and 117 through a wafer stage driving circuit 142 on the basis of the supplied coordinates. Assume that an inverted image is projected through the projection lens PL at a projection magnification β (β is, e.g., ¼). The reticle R is scanned through the reticle stage 113 at a velocity VR in the +X-direction (or −X-direction) with respect to the illumination area. In synchronism with this scanning operation, the wafer W is scanned through the X-stage 117 at a velocity VW (=β·VR) in the −X-direction (or +X-direction).

In the projection exposure apparatus, the alignment between the reticle R and the wafer W must be performed with a high accuracy prior to the exposure of the pattern area. Methods of detecting the position of a mark on a wafer are roughly classified into three methods. The first method is a method of picking up the image of the mark and processing this image to detect its position. The second method is a laser beam scan method of relatively scanning a lattice alignment mark having a periodicity in a direction orthogonal to a measurement direction and a sheet beam from an He-Ne laser, and detecting the mark position on the basis of a change in intensity of the light beam scattered or diffracted by this mark. The third method is a method called "lattice alignment" using a lattice alignment mark having a periodicity in a measurement direction. This method further includes a homodyne method and a heterodyne method in accordance with the arrangements of optical systems. In addition, as a position detection optical system, there are an off-axis method using a microscope provided in addition to a projection lens, and a TTL (Through The Lens) method using a projection lens as a position detection optical system. In this embodiment, a position detection optical system (alignment sensor) 120 of the TTL method is illustrated in FIG. 4. An alignment signal obtained by the alignment sensor 120 is supplied to the main control system 150.

The arrangement of a multi-point focus position detection system (to be referred to as an "AF sensor" hereinafter) 119 (119S, 119R) for detecting a Z-directional position (focus position) on the surface of the wafer W will be explained. In the multi-point AF sensor 119, detection light which does not affect a photoresist is emitted from the light source 119S. The detection light is projected on fields on the wafer W obliquely with respect to the optical axis of the projection lens PL. The reflected light beams from these measurement points are condensed by the light-receiving portion 119R to form an image. The reflected light beams which form an image are photoelectrically converted by a large number of photoelectric conversion elements, respectively. These photoelectrically converted signals are then processed. The AF sensor obtains a focus position on the wafer W and the tilt of the wafer W. The focus position on the wafer W and the tilt of the wafer W are supplied to the main control system 150.

Figure 5:
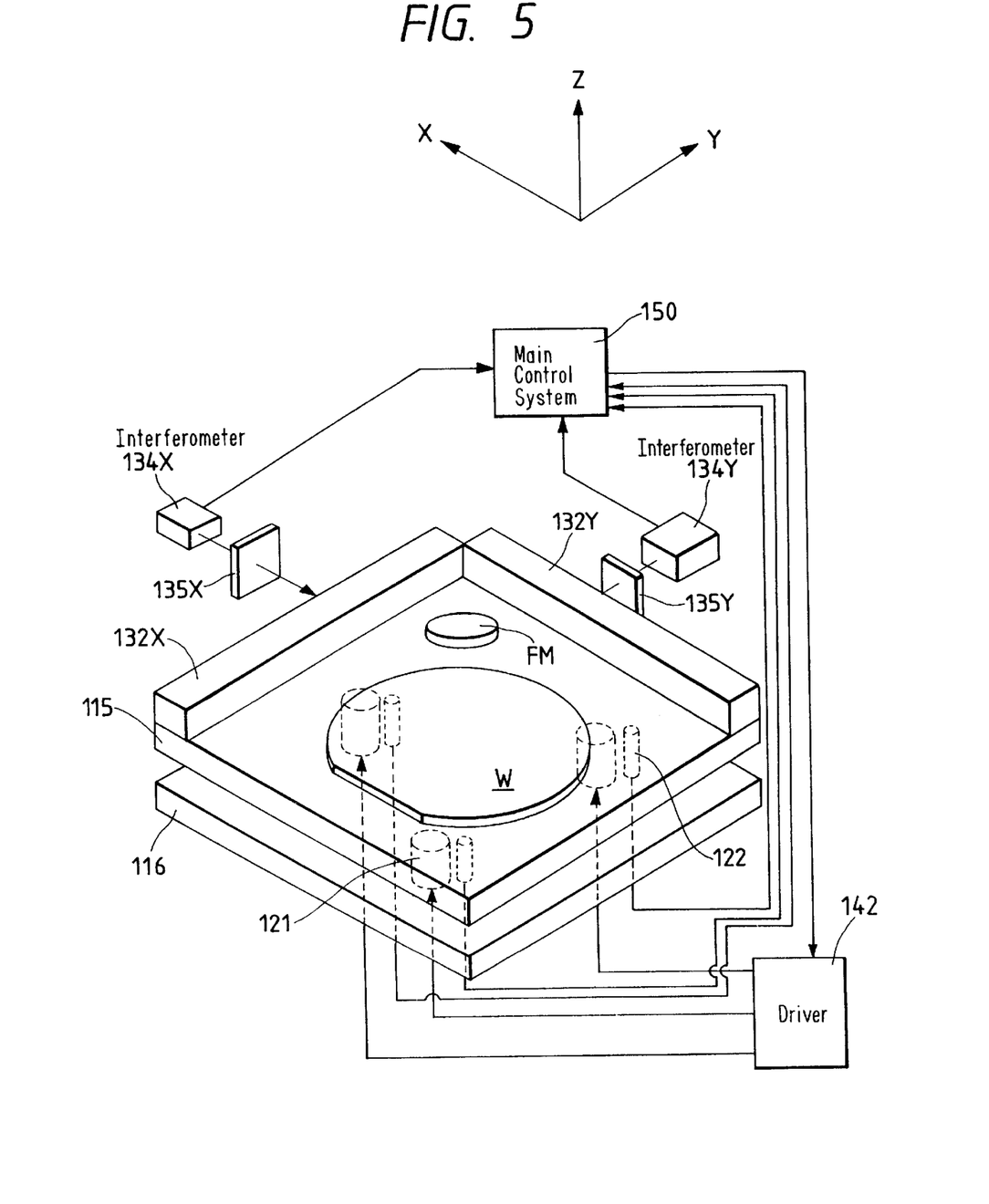
FIG. 5 is a view showing an arrangement around a focus leveling stage for a wafer W.

FIG. 5 is a perspective view showing the control around the focus leveling stage 115 in this embodiment.

Referring to FIG. 5, the movable mirrors 132X and 132Y for the X- and Y-axes are fixed to the upper surface of the focus leveling stage 115. A laser beam from the laser interferometer 134X is irradiated on the movable mirror 132X to always monitor the X-coordinate of the wafer W.

The plane-parallel plate 135X is placed between the movable mirror 132X and the laser interferometer 134X to bend the optical path of the laser beam. The Y-coordinate of the wafer W is always monitored by the Y-axis movable mirror 132Y and the laser interferometer 134Y. Similar to the X-axis, the plane-parallel plate 135Y is placed between the movable mirror 132Y and the laser interferometer 134Y. The X- and Y-coordinates detected by these members are supplied to the main control system 150.

Note that FIG. 5 illustrates only one X-axis laser interferometer 134X and one Y-axis laser interferometer 134Y. However, one more laser interferometer (not shown) is provided to each axis in order to measure yawing.

The actuator 121 is constituted by a system using a rotary motor and a cam, using a multilayered piezo electric, or the like. When a driving element which is linearly displaced is used as the actuator 121 in this manner, the linear encoder 122 of, e.g., an optical type or a capacitance type as an encoder for detecting a Z-directional position is arranged near the actuator 121. Z-directional values obtained by the linear encoders 122 at three fulcrums are supplied to the main control system 150. The main control system 150 calculates the Z-directional position of the wafer W and the tilt angles thereof about the X- and Y-axes on the basis of the Z-directional values at the three fulcrums. Based on information about the focus position of the AF sensor and information about, e.g., the Z-directional position and tilt angles of the wafer W, the main control system 150 supplies a control signal to the wafer stage driving circuit 142. The wafer stage driving circuit 142 uniformly stretches and contracts the three actuators 121 to adjust the Z-directional position of the focus leveling stage 115, and independently adjusts the stretching/contracting quantities of the three actuators 121 to adjust the tilt angles of the focus leveling stage 115 about the X- and Y-axes.

Figure 6A:
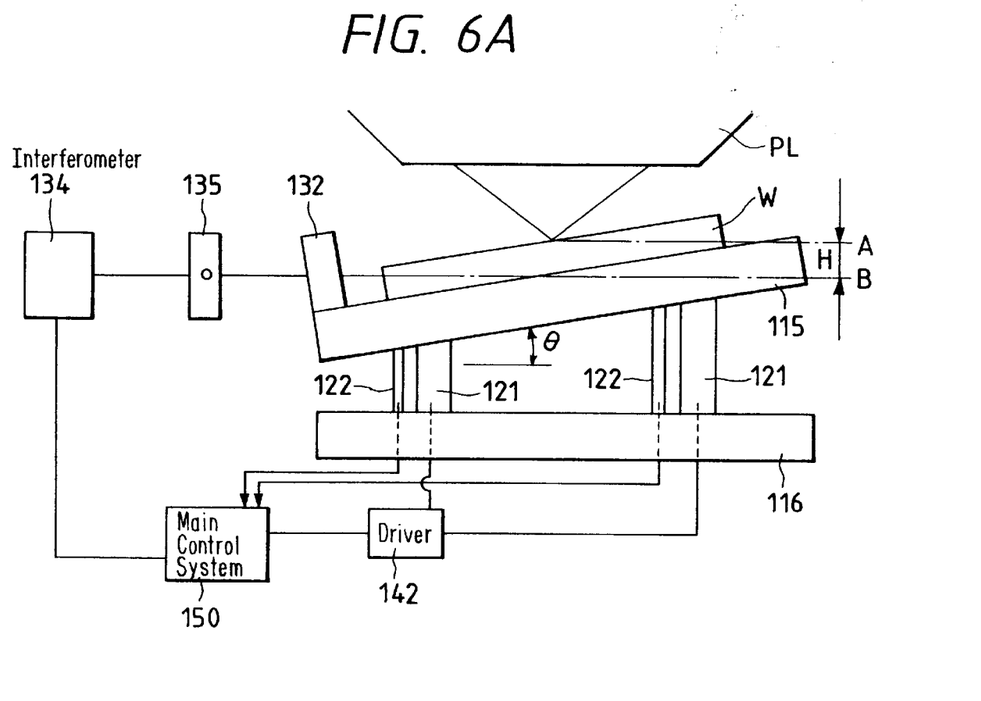
FIG. 6A is a view showing a state where a difference H (in the Z-direction) is generated between a measurement position B of a laser interferometer and an imaging position A of a projection lens due to the tilting of the focus leveling stage.

Next, a difference H between an imaging surface A of the projection lens PL and a measurement position B of the laser interferometer in the above-described scanning type projection exposure apparatus will be described with reference to FIG. 6A. In FIG. 6A, only a difference in the scanning direction (X-direction) will be explained.

The focus leveling stage 115 is moved by the three actuators 121 mounted on the Y-axis stage so as to set the wafer W to an imaging position A obtained by the multi-point AF sensor 119. At this time, the focus leveling stage 115 is tilted by an angle θ (about Y-axis), and the movable mirror 132X is also tilted by an angle (90°−θ). On the other hand, a laser beam from the laser interferometer 134X is irradiated on the measurement position B of the movable mirror 132X. For this reason, a Z-directional difference between the imaging position A and the measurement position B becomes H. In this case, the X-coordinate obtained by the laser interferometer 134X undesirably includes an Abbe error E. Note that the Abbe error E is given by $$E \approx H*\sin\theta \approx H*\theta \quad (7)$$

Figure 8:
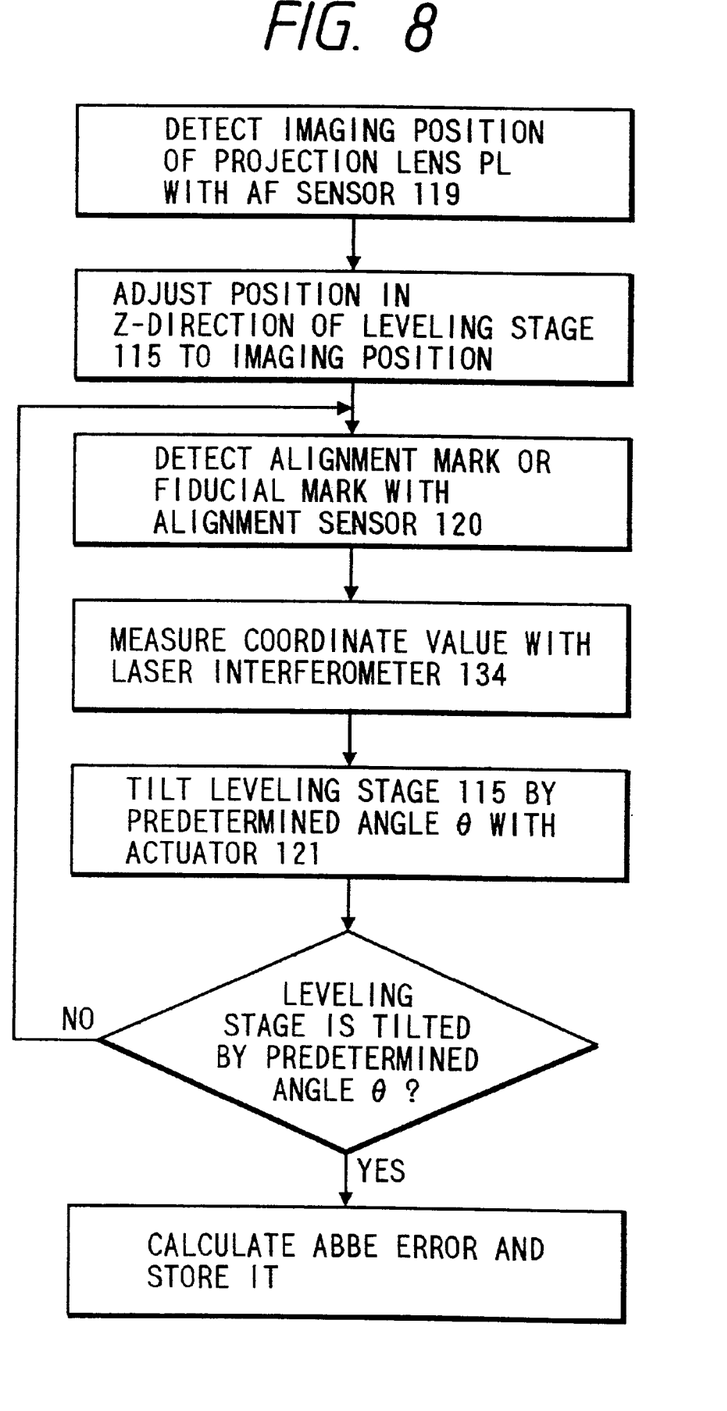
FIG. 8 is a flow chart explaining a measurement process of the Abbe error E.

Next, the measurement of the Abbe error E caused by the difference H between the image surface A of the projection lens PL and the measurement position B of the laser interferometer will be explained (see FIG. 8).

To start with, an imaging position is obtained by the AF sensor 119. The focus leveling stage 115 is moved horizontally along a plane orthogonal to the optical axis of the projection lens PL to adjust the wafer W to the imaging position. The X-stage 117 and the Y-stage 116 are moved to set the wafer W such that an alignment mark or a fiducial mark FM formed on the wafer W can be measured by the TTL alignment sensor 120. While keeping the alignment mark at the imaging position A of the projection lens PL in this state, the focus leveling stage 115 is tilted stepwise by the actuators 121 from a tilt (−θ0) to a tilt (+θ0). The deviation of the X-coordinate obtained by the laser interferometer 134 in tilting is defined as Xif. A deviation obtained by the TTL alignment sensor 120 in tilting the focus leveling stage 115 is defined as Xalg. The deviations Xif and Xalg at various tilt angles θ are prepared by tilting the focus leveling stage 115 within a tilt range (through a predetermined rotation angle θ). The main control system 150 can calculate the actual Abbe error E of the laser interferometer caused depending on the tilt angle of the focus leveling stage 115 in accordance with formula (8):

$$E = Xalg - Xif \quad (8)$$

The Abbe error E for each tilt angle θ is stored in a memory in the main control system 150.

Although the alignment mark on the wafer W is detected by the TTL alignment sensor 120, the fiducial mark FM on the focus leveling stage 115 may be detected by the TTL alignment sensor 120. Further, the deviation Xalg is always 0 in some cases.

Although the TTL alignment sensor 120 is used in obtaining the actual Abbe error E of the laser interferometer 134X, an alignment sensor of the off-axis method may be employed. In addition, the position detection method may be any one of the first method (the image of a mark is picked up and processed), the second method (the laser beam scan method of relatively scanning a lattice alignment mark and a sheet beam from a laser), and the third method (lattice alignment), which has already been described.

Figure 7:
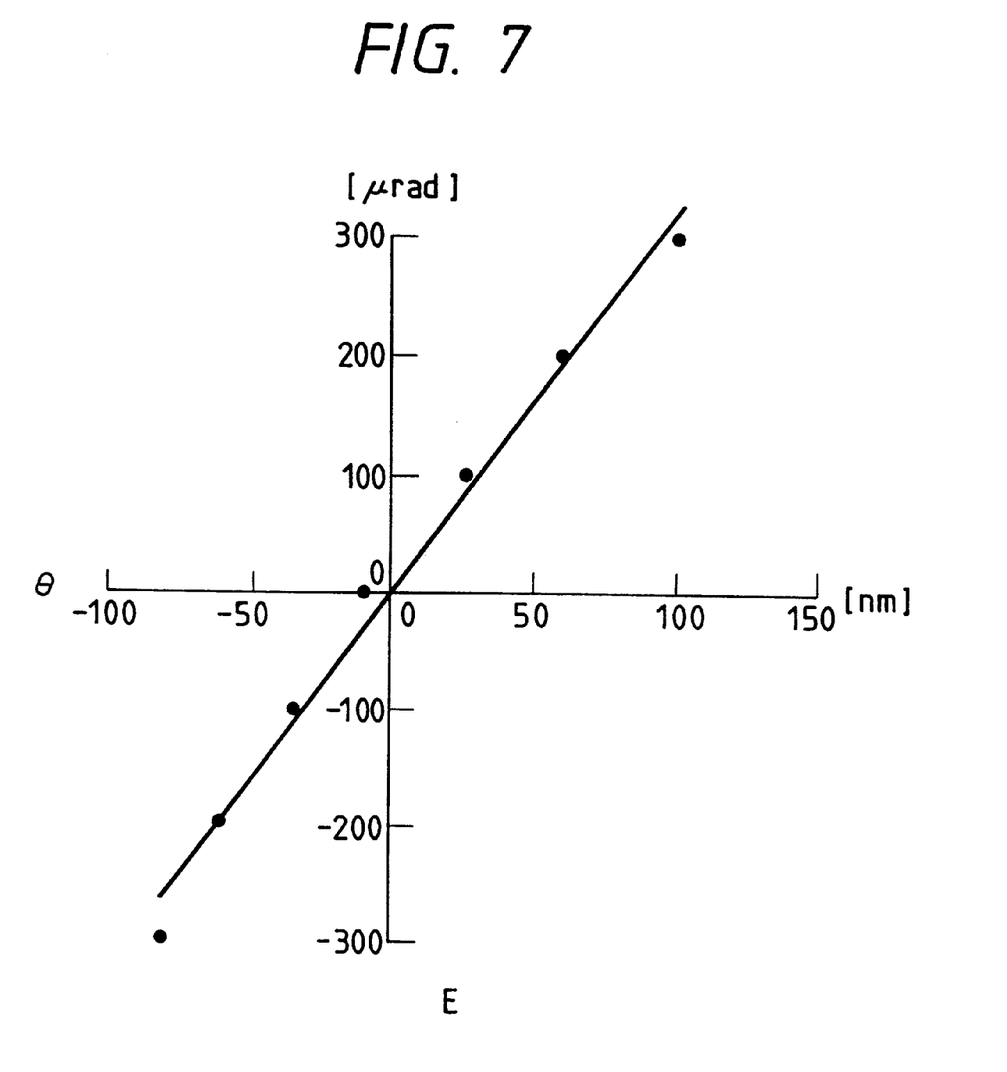
FIG. 7 is a graph showing the relationship between a tilt angle θ of the focus leveling stage and an Abbe error E.

FIG. 7 shows the relationship between the tilt quantity θ of the focus leveling stage 115 and the actual Abbe error E. As shown in FIG. 7, the tilt quantity θ and the Abbe error E have a proportional relationship.

Note that if the travel guide surface of the XY-stage has undulations, and the XY-stage has a tilt Φ, the Abbe error E is given by $$E = H(\theta + \Phi) \quad (9)$$

The undulation Φ of the travel guide surface of the stage changes depending on the positions of the Y- and X-stages 116 and 117. For this reason, even if the tilt θ of the focus leveling stage 115 with respect to the XY-stage is 0, the tilt of the movable mirror 132 with respect to a laser beam from the laser interferometer 134 changes.

More specifically, if the difference H between the image surface A of the projection lens PL and the measurement position B of the laser interferometer 134 is not 0, the difference H adversely affects the lattice properties of the array of exposure shots. Since the undulation Φ is constant in a state wherein the Y- and X-stages 116 and 117 are stopped at specific positions (about both the Y- and X-axes), the difference H between the imaging surface A and the measurement position B is calculated as a proportional coefficient between the tilt quantity θ of the focus leveling stage 115 and the Abbe error E, as represented by FIG. 7 and formulas (7) and (9).

Figure 6B:
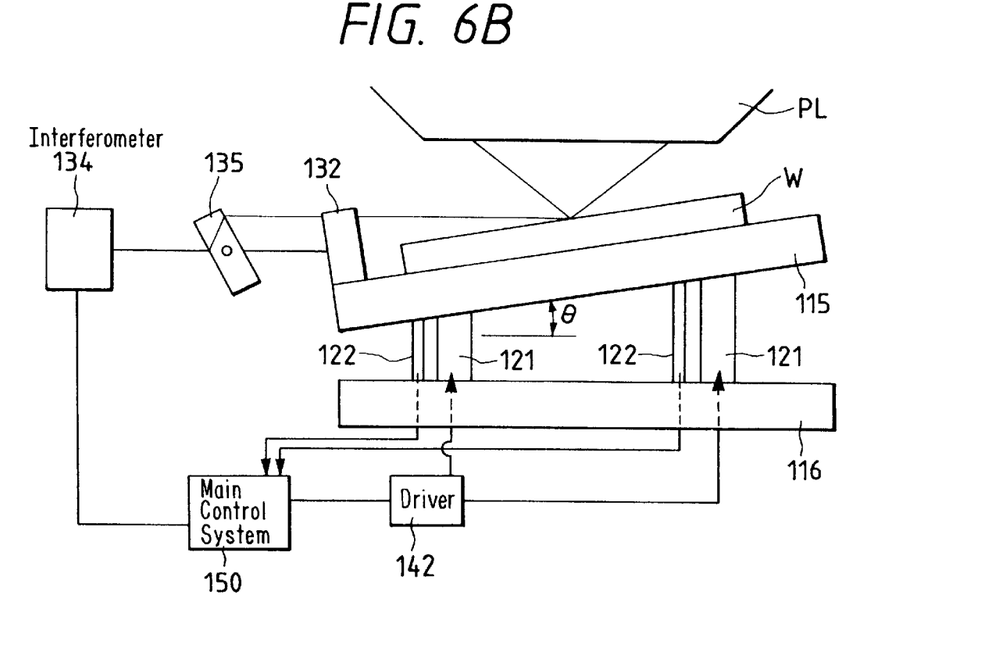
FIG. 6B is a view of a state where the difference H (in the Z-direction) is corrected by a plane-parallel plate.

The plane-parallel plate 135 is therefore rotated and adjusted so as to set the difference H to be 0. FIG. 6B shows this state.

Actually, the movable mirror 132 is tilted by driving the focus leveling stage 115, thereby causing the Abbe error E. Furthermore, the optical path itself of the laser interferometer 134 is tilted with the tilting of the movable mirror 132. Accordingly, the tilt angle θ of the focus leveling stage 115 and the Abbe error E have not a completely linear relationship but an almost parabolic relationship, as indicated by a plurality of plotted points.

Since the error component is proportional to the square of the angle θ, this component cannot be eliminated by adjusting the position of the laser interferometer 134. Taking this component into consideration, an error E' of the laser interferometer 134 can be expressed as follows:

$$E'=A*\theta*\theta+B*\theta+E \qquad (10)$$

Coefficients A and B are variables determined by the length of the optical path of the laser interferometer 134 and the mounting error of the movable mirror 132, and can be measured in advance. In exposure, this error can be corrected by adjusting the stage position.

When the tilt Φ of the stage due to the undulation is added, the above correction cannot eliminate an error. However, the influence of this error is less than the Abbe error E which is dominant in the error E'.

In the above-described embodiment, the Abbe error E in the focus leveling stage 115 for the wafer W has been explained. The above explanation can be applied to the reticle stage 113, as a matter of course. In addition, the scanning type projection exposure apparatus has been described. This embodiment can be similarly applied to any apparatus in which a movable mirror is mounted on a leveling stage and the movable mirror is also tilted with the tilting of the leveling stage.

As has been described above, according to the present invention, the Abbe error E caused by the difference H between the measurement position of a laser interferometer and the imaging surface of a projection optical system can be obtained while tilting a leveling stage by using a position detection optical system. A plane-parallel plate is placed between the laser interferometer and a movable mirror and can be adjusted to align the measurement position of the interferometer with the imaging surface of a projection lens. The Abbe error E can be eliminated from a coordinate value obtained by the laser interferometer. In the scanning type projection exposure apparatus, therefore, a coordinate can be obtained by the laser interferometer with a high accuracy even when a projection area (illumination slit area; narrower than a shot area) of the reticle R is tilted in the scanning direction (X-axis direction) and the reticle R is scanned by a quantity corresponding to the shot area to obtain a contact hole for a doubled or tripled focal depth, or even when the guide surfaces of X- and Y-stages have undulations.

What is claimed is:

1. A projection exposure apparatus which exposes a substrate with a projected image of a mask through a projection optical system, comprising:
   a mask table which is arranged at an object side of said projection optical system to hold said mask;
   a wafer table which is arranged at an image side of said projection optical system to hold said substrate, which is able to be tilted, and which is movable in a direction of an optical axis of said projection optical system, said wafer table being provided with a reflection surface thereon;
   an interferometer having a measurement axis with respect to said reflection surface to detect a first displacement amount of said substrate, in a predetermined direction perpendicular to said direction of the optical axis;
   a detection device independent from said interferometer, which detects a second displacement amount of said substrate, different from said first displacement amount, in said predetermined direction, said displacement amount being generated due to the tilt of said wafer table; and
   an adjusting device connected to one of said mask table and said wafer table to adjust relative positional relationship in said predetermined direction between an image plane of said projection optical system and said substrate, based on said second displacement amount.

2. An apparatus according to claim 1, wherein said adjusting device includes an optical sensor having a measurement point in a field of said projection optical system to detect information concerning a position of said substrate in a direction along the optical axis of said projection optical system.

3. An apparatus according to claim 2, wherein said detection device includes a calculator which calculates said second displacement amount based on information concerning tilt correction of said substrate, said information being obtained from said adjusting device.

4. An apparatus according to claim 3, wherein said detection device includes a sensor which detects information concerning drive amount of said one table by said adjusting device, said second displacement amount being calculated based on the detected information.

5. An apparatus according to claim 4, wherein said sensor detects position information of said wafer table with respect to a direction along the optical axis of said projection optical system at a plurality of points on said wafer table.

6. An apparatus according to claim 3, wherein said calculator uses, upon calculation of said second displacement amount, information concerning a positional difference with respect to a direction along the optical axis of said projection optical system, between an exposure plane of said substrate and a plane perpendicular to the optical axis of said projection optical system and including the measurement axis of said interferometer.

7. An apparatus according to claim 6, wherein said calculator successively calculates variation in said information concerning the positional difference and uses said variation upon calculation of said second displacement amount.

8. An apparatus according to claim 3, wherein said calculator uses, upon calculation of said second displacement amount, at least one of (1) information concerning a distance between an area on said substrate on which a pattern on said mask is transferred and said reflection surface and (2) information concerning optical path length of said interferometer.

9. An apparatus according to claim 3, wherein said calculator uses, upon calculation of said second displacement amount, information concerning tilt amount of said reflection surface with respect to the optical axis of said projection optical system.

10. An apparatus according to claim 1, wherein said interferometer is of a double-path type which radiates laser beam onto said reflection surface twice.

11. An apparatus according to claim 1, further comprising:
    a correction device connected to said detection device to correct said first and second displacement amounts by means of relative movement of said mask and said substrate.

12. An apparatus according to claim 11, wherein said correction device includes a first driving system which holds said mask table at an object side of said projection optical system such that said mask table is movable and a second driving system which holds said wafer table such that said wafer table is movable, so as to move at least one of said mask and said substrate.

13. An apparatus according to claim 12, wherein said correction device moves said mask with said first driving system to correct said second displacement amount.

14. An apparatus according to claim 12, further comprising:
   a scanning exposure system connected to said first and second driving systems to scanningly expose said substrate by synchronous movement of said mask and said substrate.

15. An apparatus according to claim 1, further comprising:
   a base on which said wafer table is disposed;
   a support on which said projection optical system is mounted; and
   a vibration prevention system on which said base and said support are arranged.

16. A projection exposure apparatus which exposes a substrate with a projected image of a mask through a projection optical system, comprising:
   a table which is arranged at an image side of said projection optical system to hold said substrate, which is able to be tilted such that the substrate assumes a tilted position, and which is movable in a direction of an optical axis of said projection optical system;
   a tilt detection device which detects a tilt amount of said table;
   a mark detection system with a detection area disposed at the image side of said projection optical system to detect a mark on said table; and
   a detection device electrically connected to said tilt detection device and said mark detection system to detect information concerning relationship between a displacement amount of said substrate in a plane perpendicular to an optical axis of said projection optical system and a tilt angle of said substrate, based on mark position information detected by said mark detection system and a tilt amount of said table when said table is tilted, which change in accordance with the tilt of said table.

17. An apparatus according to claim 16, wherein said table is provided with a reflection surface, and said projection exposure apparatus further comprises an interferometer having a measurement axis with respect to said reflection surface, and said detection device is electrically connected to said interferometer to detect said relationship between the displacement amount and the tilt angle using table position information which changes with tilt of said table, detected by said interferometer.

18. An apparatus according to claim 17, further comprising:
   a correction device connected to said detection device to compensate displacement of said substrate generated due to the tilt of said table.

19. An apparatus according to claim 18, wherein said correction device includes an optical device which shifts the measurement axis of said interferometer in a direction along the optical axis of said projection optical system based on said information concerning relationship.

20. An apparatus according to claim 17, further comprising:
   a first driving system which holds said mask at an object side of said projection optical system such that said mask is movable;
   a second driving system which holds said table such that said table is movable; and
   a scanning exposure system connected to said first and second driving systems to scanningly expose said substrate by synchronous movement of said mask and substrate.

21. A projection exposure apparatus which exposes a substrate with a projected image of a mask through a projection optical system, comprising:
   a table which can be tilted, arranged at an image side of said projection optical system to hold said substrate;
   an interferometer having a measurement axis with respect to a reflection surface provided on said table; and
   an optical device arranged between said interferometer and said reflection surface to shift at least a portion of said measurement axis in a direction of an optical axis of said projection optical system.

22. An exposure method for exposing a substrate with a projected image of a mask through a projection optical system, comprising:
   detecting a first displacement amount of said substrate in a plane perpendicular to an optical axis of said projection optical system, by means of an interferometer having a measurement axis with respect to a reflection surface provided on a table which is able to be tilted while holding said substrate and which is movable in a direction of said optical axis; and
   detecting a second displacement amount of said substrate in said plane, which is generated due to the tilt of said table without change in measured value by said interferometer, said second displacement amount being different from said first displacement amount.

23. A method according to claim 22, further comprising:
   adjusting positional relationship of said mask and said substrate with respect to a direction perpendicular to said optical axis of said projection optical system based on said first and second displacement amounts.

24. A method according to claim 23, wherein said mask is moved to compensate at least said second displacement amount among said first and second displacement amounts.

25. A method according to claim 22, wherein upon detection of said second displacement amount, said second displacement amount is calculated based on information concerning tilt correction of said substrate obtained from a device which adjusts relative tilt between an image plane of said projection optical system and said substrate, said device including said table.

26. A method according to claim 25, wherein information concerning a positional difference, with respect to a direction along said optical axis of said projection optical system, between an exposure plane of said substrate and a plane perpendicular to the optical axis of said projection optical system and including the measurement axis of said interferometer is used for the calculation of said second displacement amount.

27. A method according to claim 26, further comprising:
   successively calculating variation in said information concerning the positional difference so that the variation is used for the calculation of said second displacement amount.

28. A method according to claim 25, wherein at least one of (1) information concerning a distance between an area on said substrate on which a pattern on said mask is transferred and said reflection surface and (2) information concerning optical path length of said interferometer is used for the calculation of said second displacement amount.

29. A method according to claim 25, wherein information concerning tilt amount of said reflection surface with respect to the optical axis of said projection optical system is used for calculation of said second displacement amount.

30. A projection exposure method for exposing a substrate with a projected image of a mask through a projection optical system, comprising:

tilting a table which is able to be tilted while holding said substrate, and which is movable in a direction of an optical axis of said projection optical system;

monitoring a tilt amount of said table;

detecting position information of a mark on said table, which changes in accordance with the tilt of said table; and obtaining information on relationship between a displacement amount of said substrate in a plane perpendicular to said optical axis and a tilt angle of said substrate, based on the monitored tilt amount and said position information of the mark.

31. A projection exposure method for exposing a substrate held on a table which is able to be tilted, with a projected image of a mask through a projection optical system, comprising:

measuring a position of said substrate by means of an interferometer having a measurement axis with respect to a reflection surface provided on said table; and shifting at least a portion of said measurement axis between said interferometer and said reflection surface in a direction of an optical axis of said projection optical system, in accordance with a tilt of said table.

32. A method of manufacturing a device, wherein a substrate used in forming the device is exposed with a projected image of a mask through a projection optical system, said method comprising:

detecting a first displacement amount of said substrate in a plane perpendicular to an optical axis of said projection optical system, by means of an interferometer having a measurement axis with respect to a reflection surface provided on a table which is able to be tilted while holding said substrate and moveable in the direction of said optical axis;

detecting a second displacement amount of said substrate in said plane, which is generated due to the tilt of said table without change in measured value by said interferometer, said second displacement amount being different from said first displacement amount; and adjusting positional relationship of said mask and said substrate with respect to a direction perpendicular to said optical axis of said projection optical system based on said first and second displacement amounts.

* * * * *